(12) United States Patent
Li et al.

(10) Patent No.: US 11,309,514 B2
(45) Date of Patent: Apr. 19, 2022

(54) OLED SUBSTRATE AND OLED DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jiewei Li, Beijing (CN); Dandan Zang, Beijing (CN); Chuan Yin, Beijing (CN); Yong Cui, Beijing (CN); Yachao Tong, Beijing (CN); Xianjiang Xiong, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 216 days.

(21) Appl. No.: 16/619,083

(22) PCT Filed: May 13, 2019

(86) PCT No.: PCT/CN2019/086666
§ 371 (c)(1),
(2) Date: Dec. 3, 2019

(87) PCT Pub. No.: WO2020/124940
PCT Pub. Date: Jun. 25, 2020

(65) Prior Publication Data
US 2021/0336189 A1    Oct. 28, 2021

(30) Foreign Application Priority Data
Dec. 17, 2018 (CN) .......................... 201811543965.X

(51) Int. Cl.
*H01L 51/52* (2006.01)
*H01L 27/32* (2006.01)
*H01L 51/56* (2006.01)

(52) U.S. Cl.
CPC ........ *H01L 51/5228* (2013.01); *H01L 27/326* (2013.01); *H01L 27/3246* (2013.01);
(Continued)

(58) Field of Classification Search
CPC ............ H01L 51/5206; H01L 51/5209; H01L 51/5221; H01L 51/5225; H01L 51/5228;
(Continued)

(56) References Cited

U.S. PATENT DOCUMENTS 9,246,123 B2    1/2016   Kim et al.
9,966,554 B2 *  5/2018   Lee ..................... H01L 51/5215
(Continued)

FOREIGN PATENT DOCUMENTS

CN    101847649 B    5/2014
CN    104393188 A    3/2015
(Continued)

OTHER PUBLICATIONS

International Search Report in Application No. PCT/CN2019/086666, dated Sep. 18, 2019.
(Continued)

*Primary Examiner* — Scott B Geyer
(74) *Attorney, Agent, or Firm* — Syncoda LLC; Feng Ma

(57) ABSTRACT

An organic light-emitting diode (OLED) substrate includes: a base substrate including a display region having a plurality of luminous regions and a non-luminous region separating one or more adjacent luminous regions, the non-luminous region including a plurality of first connection regions; a first electrode layer over the base substrate including a plurality of first electrodes having their projections on the base
(Continued)

substrate cover the plurality of luminous regions; a pixel defining layer over the first electrode layer and located at the non-luminous region and defining the plurality of luminous regions, the pixel defining layer is hollowed out at the first connection regions; an electroluminescent functional layer provided over the pixel defining layer; a second electrode layer over the electroluminescent functional layer; and a plurality of conductive structures located at the plurality of first connection regions respectively, and electrically coupled to the second electrode layer.

16 Claims, 8 Drawing Sheets

(52) U.S. Cl.
CPC ...... *H01L 27/3258* (2013.01); *H01L 51/5253* (2013.01); *H01L 51/56* (2013.01); *H01L 2227/323* (2013.01)

(58) Field of Classification Search
CPC ............. H01L 51/5253; H01L 27/3258; H01L 27/326; H01L 27/3283; H01L 27/3295; H01L 27/3246
See application file for complete search history.

(56) References Cited

U.S. PATENT DOCUMENTS

| | | | |
|---|---|---|---|
| 2010/0060147 A1* | 3/2010 | Eom | H01L 51/5234 |
| | | | 313/504 |
| 2013/0099218 A1* | 4/2013 | Lee | H01L 51/5203 |
| | | | 257/40 |
| 2014/0346459 A1 | 11/2014 | Song et al. | |
| 2014/0353609 A1* | 12/2014 | Song | H01L 51/5221 |
| | | | 257/40 |
| 2016/0204171 A1* | 7/2016 | Lee | H01L 27/3246 |
| | | | 257/40 |
| 2016/0351851 A1* | 12/2016 | Lee | H01L 27/3258 |
| 2017/0125725 A1 | 5/2017 | Paek et al. | |
| 2018/0287093 A1* | 10/2018 | Lee | H01L 51/5209 |
| 2019/0097162 A1* | 3/2019 | Wang | H01L 27/3246 |
| 2019/0140039 A1* | 5/2019 | Lee | H01L 27/3276 |

FOREIGN PATENT DOCUMENTS

| | | |
|---|---|---|
| CN | 106057844 A | 10/2016 |
| CN | 106206645 A | 12/2016 |
| CN | 108122944 A | 6/2018 |

OTHER PUBLICATIONS

CN Second Office Action in Application No. 201811543965.X, dated Mar. 2, 2020.

* cited by examiner

OLED SUBSTRATE AND OLED DISPLAY APPARATUS

CROSS-REFERENCE TO RELATED APPLICATION

The present application claims priority to Chinese Patent Application No. 201811543965.X filed on Dec. 17, 2018, the disclosure of which is hereby incorporated by reference in its entirety.

TECHNICAL FIELD

The present disclosure relates generally to a field of display technologies, and specifically to an OLED substrate and an OLED display apparatus.

BACKGROUND

OLED (organic light-emitting diode) display devices have advantages such as self-luminosity, fast response speed, high brightness level, full viewing-angle and flexibility. As such, OLED display technologies have become a promising prospect for next-generation technologies, and have also become competitive in various present display products.

Presently, there are two types of OLED display devices: bottom-emitting structure and top-emitting structure. It may be difficult to realize high-definition display in bottom-emitting OLED display devices because the aperture ratio of bottom-emitting OLED display devices is relatively small.

On the other hand, top-emitting OLED display devices are more advantageous for realizing high-definition display because the aperture ratio of top-emitting OLED display devices is relatively large. As such, at present, top-emitting OLED display devices have attracted more attention.

SUMMARY

In a first aspect, an organic light-emitting diode (OLED) substrate is provided, including:

a base substrate, including a display region, the display region being divided into a plurality of luminous regions and a non-luminous region separating one or more adjacent luminous regions, the non-luminous region including a plurality of first connection regions;

a first electrode layer provided over the base substrate, wherein the first electrode layer includes a plurality of first electrodes, the projection of the plurality of the first electrodes on the base substrate covers the plurality of luminous regions;

a pixel defining layer provided on the first electrode layer, wherein the pixel defining layer is located at the non-luminous region and defines the plurality of luminous regions, the pixel defining layer is hollowed out at the first connection regions;

an electroluminescent functional layer provided on the pixel defining layer;

a second electrode layer provided on the electroluminescent functional layer; and a plurality of conductive structures located at the plurality of first connection regions respectively, wherein the plurality of conductive structures are electrically coupled to the second electrode layer.

In some embodiments, the electroluminescent functional layer is disconnected from the first connection regions at an edge portion of the first connection regions.

In some embodiments, surfaces of the conductive structures that are opposite from the base substrate are higher than a surface of the pixel defining layer that is opposite from the base substrate both with respect to an upper surface the base substrate.

In some embodiments, the conductive structures are located between the electroluminescent functional layer and the second electrode layer.

In some embodiments, the conductive structures are located at a side of the second electrode layer that is opposite from the electroluminescent functional layer.

In some embodiments, the non-luminous region further comprises a plurality of second connection regions, wherein at least one second connection region is adjacent to at least one first connection region;

wherein the OLED substrate further comprises:

a plurality of elevating cushions provided at the second connection regions; and a plurality of first auxiliary electrodes provided on the plurality of elevating cushions, wherein at least one first auxiliary electrode covers sides of an elevating cushion and a surface of an elevating cushion that is opposite from the base substrate;

wherein at least one conductive structure is in contact with the portion of the first auxiliary electrode located at the sides of the elevating cushions.

In some embodiments, the pixel defining layer is hollowed out at the second connection regions, and wherein the first auxiliary electrodes and the first electrode layer are located at a same layer and made of a same material.

In some embodiments, the OLED substrate further includes a plurality of thin film transistors and a planarization layer configured between each of the thin film transistors and the first electrode layer, wherein each thin film transistor includes a source electrode, a drain electrode, an active layer, a gate electrode and a gate insulating layer, the drain electrode being electrically connected to a first electrode.

In some embodiments, each elevating cushion comprises at least one of a first elevating sub-layer, a second elevating sub-layer, a third elevating sub-layer, a fourth elevating sub-layer, and a fifth elevating sub-layer being arranged in a stacked configuration;

the first elevating sub-layer and the active layer are located at a same layer and made of a same material;

a portion of the gate insulating layer that is located at a second connection region forms a second elevating sub-layer;

the third elevating sub-layer and the gate electrodes are located at a same layer and made of a same material;

the fourth elevating sub-layer, the source electrodes and the drain electrodes are located at a same layer and made of the same material; and the fifth elevating sub-layer and the planarization layer are located at a same layer and made of a same material.

In some embodiments, a side portion of a fifth elevating sub-layer is connected to a surface of the fifth elevating sub-layer that is close to the second electrode layer by means of an arc segment.

In some embodiments, each of the thin film transistors further includes:

an interlayer dielectric layer being hollowed out at the first connection regions;

wherein portion of the interlayer dielectric layer located at the second connection region forms a sixth elevating sub-layer.

In some embodiments, a side portion of the sixth elevating sub-layer is provided as an inclined plane, wherein a surface area of a sixth elevating sub-layer that is close to the second electrode layer is larger than an alternative surface area of a sixth elevating sub-layer that is opposite from the second electrode layer.

In some embodiments, the OLED substrate further includes a passivation layer provided between the thin film transistors and the planarization layer, wherein a portion of the passivation layer located at a second connection region forms a seventh elevating sub-layer of the elevating layer.

In some embodiments, a side portion of the seventh elevating sub-layer is provided as an inclined plane, the surface area of a seventh elevating sub-layer that is close to the second electrode layer is larger than the surface areas of a seventh elevating sub-layer that is opposite from the second electrode layer.

In some embodiments, a plurality of conductive structures are provided at a first side and a second side of each elevating cushion, the second side is opposite to the first side, at least a portion of each of the first auxiliary electrodes being located at the first side and the second side of the elevating cushion, wherein each the first auxiliary electrode are in contact with the conductive structures provided at both sides of the elevating cushion.

In some embodiments, each of the conductive structures are provided as strips extending in the direction parallel to any side of the substrate.

In some embodiments, the conductive structures are provided in the form of points.

In another aspect, an organic light-emitting diode (OLED) display apparatus is provided, comprising:

an OLED substrate; and a packaging layer, wherein the packaging layer is utilized to package the OLED substrate.

In another aspect, a method of manufacturing method an organic light-emitting diode (OLED) substrate is provided, the method including:

forming a semiconductor thin film layer through a physical vapor deposition (PVD) process over the base substrate;

patterning the semiconductor thin film through a photolithography process; and implementing an etching process to form the active layer and the first elevating sub-layers of the elevating cushions simultaneously.

In some embodiments, the method further includes simultaneously forming the second elevating sub-layers of the elevating cushions with portions of the gate insulating layer that are located at the second connection regions.

In some embodiments, the method further includes forming the third elevating sub-layers of the elevating cushions concurrently with the gate electrodes, wherein the third elevating sub-layers and the gate electrodes are located at a common layer and made of a same material.

Other embodiments and implementations may become apparent in view of the following descriptions and the attached drawings.

BRIEF DESCRIPTION OF DRAWINGS

To more clearly illustrate some of the embodiments, the following is a brief description of the drawings.

The drawings in the following descriptions are only illustrative of some embodiments. For those of ordinary skill in the art, other drawings of other embodiments can become apparent based on these drawings.

DETAILED DESCRIPTION

Figure 1:
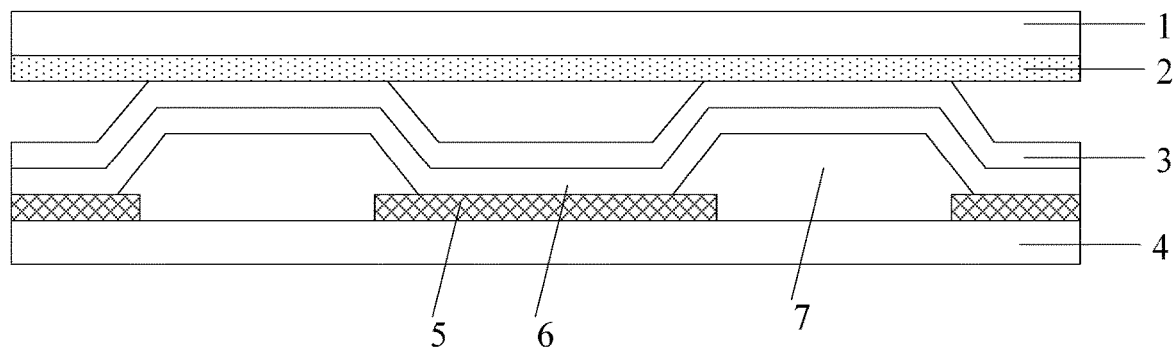
FIG. 1 illustrates a side view of a structural diagram of an OLED display apparatus in existing technologies.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. can be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or other structure is referred to as being "on" or extending "onto" another element, it can be directly on or extend directly onto the other element or intervening elements can also be present. In contrast, when an element is referred to as being "directly on" or extending "directly onto" another element, there are no intervening elements present.

Likewise, it will be understood that when an element such as a layer, region, or substrate is referred to as being "over" or extending "over" another element, it can be directly over or extend directly over the other element or intervening elements can also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Relative terms such as "below" or "above" or "upper" or "lower" or "horizontal" or "horizontal" can be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Various embodiments of the present disclosure provide an OLED substrate and an OLED display apparatus that can solve the IR-drop problem caused by excessive resistance of the second electrode layer.

The display region of the OLED substrate can be divided into a plurality of luminous regions and a non-luminous region, the non-luminous region can include a plurality of first connection regions; the OLED substrate can include: a first electrode layer, a pixel defining layer, a light-emitting functional layer and a second electrode layer provided successively over the base substrate; the pixel defining layer can be located at the non-luminous region, the pixel defining layer can define the plurality of luminous regions; the first electrode layer can include a plurality of first electrodes, each first electrode can be located in a luminous region; the pixel defining layer can be hollowed out at the first connection regions; the OLED substrate can further include conductive structures provided at the first connection regions, the conductive structures can be located at the side of the light-emitting functional layer that is opposite from the base substrate and be connected to the second electrode layer.

Herein the term "divided" does not necessarily mean physically dividing. Rather, the display region can be "divided" in an abstract way. In other words, the plurality of luminous regions and the non-luminous region can be portions of the display region without physical boundaries, dividers, or barriers.

The cathodes of top-emitting OLED display devices are usually formed through forming a layer of transparent or translucent conductive material sputtering process or an evaporation process, i.e. a physical vapor deposition process, wherein by reducing the thickness of the cathodes, a higher light transmittance can be achieved which can be correlated ton increased brightness level of the OLED display devices.

However, reduced thickness also corresponds to an increased resistance of the cathodes, where an increased resistance can cause the IR-drop to also be too large or otherwise excessive which can then be associated with various negative effects on the display properties of the OLED display devices.

In some instances, these negative effects are a result of the center of an OLED display device being relatively far from the signal input ports at the edge of the OLED display device, wherein an increase of the IR-drop caused by an overly large resistance of the cathodes can cause the electric current transmitted to the center of an OLED display device to be reduced, therefore, the brightness level of the edge of an OLED display device and the brightness level of the center of the OLED display device are not uniform, the brightness level about an edge of the OLED display device can be brighter than the brightness level of the center of the OLED display device, which is typically undesirable.

In order to solve the IR-drop problem caused by an overly large resistance of the cathode electrodes of OLED display apparatus, two methods are often implemented.

In a first method, auxiliary electrodes can be added over the transparent cathodes. For example, as illustrated in FIG. 1, a conductive layer or a plurality of lattice-shaped wires can be added as auxiliary electrodes 2 over the packaging substrate 1. The auxiliary electrodes 2 can then be in contact with the transparent cathodes 3, wherein the conductivity of the cathodes 3 can be increased by adding the auxiliary electrodes 2.

As a result, the resistance of the cathodes 3 can be reduced. However, in order for the auxiliary electrodes 2 and the cathodes 3 to be in contact with each other, OLED component, for example, an OLED component can include the anodes 5, the light-emitting functional layer 6, the cathodes 3 and the pixel defining layer 7 that is utilized to space the anodes 5, the OLED cannot be packaged with a thin film packaging layer. Therefore, the risk of deterioration of the OLED component can be increased.

Figure 2:
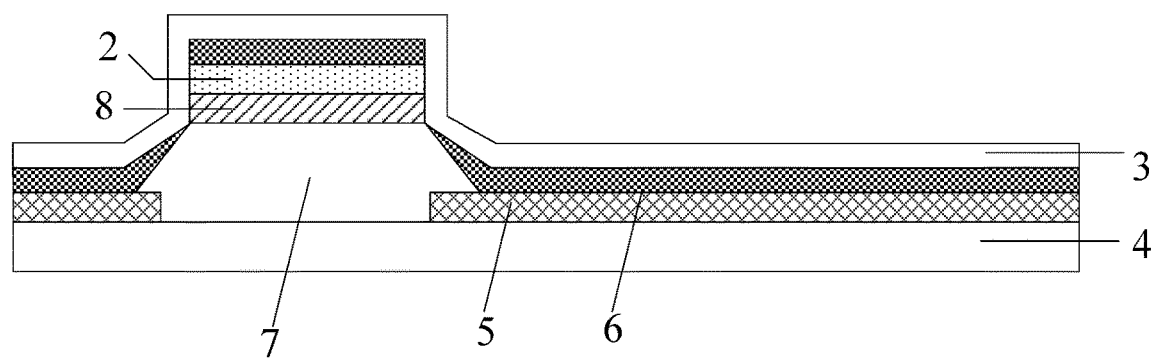
FIG. 2 illustrates a side view of a structural diagram of an OLED substrate in existing technologies.

In a second method, auxiliary electrodes can be added under the transparent cathodes 3. For example, as illustrated in FIG. 2, an insulating pattern 8 and auxiliary electrodes 2 can be added over the pixel defining layer 7 at the non-luminous region. However, in this method, the cathodes 3 can only be in contact with the sides of the auxiliary electrodes 2, wherein most parts of the auxiliary electrodes 2 are covered by the light-emitting functional layer 6.

As a result, the effect of reducing the resistance of the cathodes 3 is not realized. In addition, the formation of the insulating pattern 8 and the auxiliary electrodes 2 requires two additional filming process and an additional photolithography process, which complicates the manufacturing process of the OLED display device.

In order to solve the abovementioned problems, as well as many others, some embodiments of the present disclosure provide an OLED substrate and an OLED display apparatus that can solve the IR-drop problem caused by excessive resistance of the second electrode layer.

Figure 3:
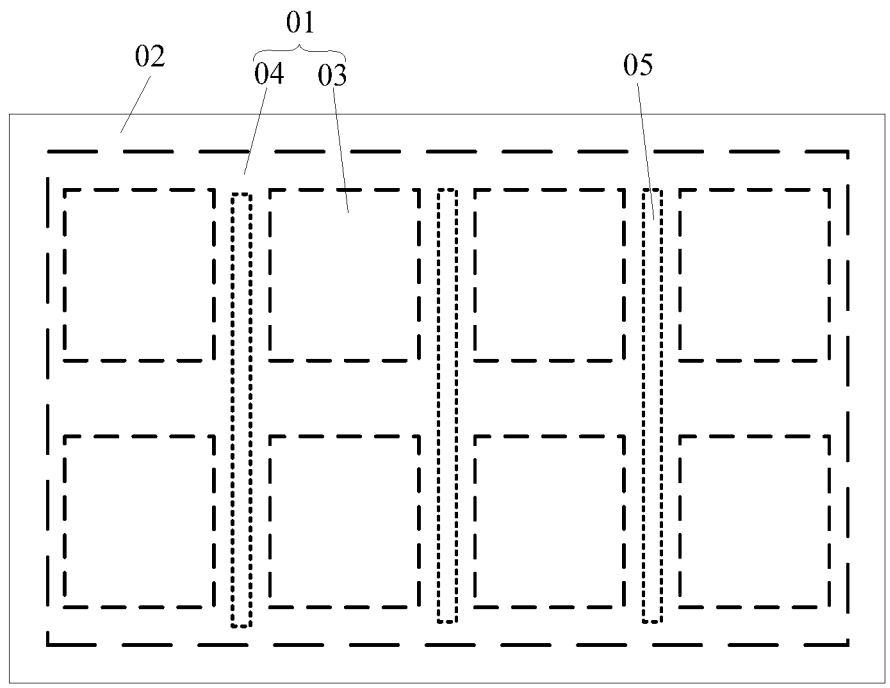
FIG. 3 illustrates a top view of a diagram of the division of different regions of an OLED substrate according to some embodiments of the present disclosure.

The OLED substrate as illustrated in FIG. 3, which particularly illustrates a top view of a structural diagram of the division of different regions of an OLED substrate according to some embodiments of the present disclosure.

As illustrated in FIG. 3, the OLED substrate according to some embodiments of the present disclosure can be divided into a display region 01 and a non-display region 02.

As illustrated herein, the display region 01 can be divided into a plurality of luminous region 03 and a non-luminous region 04, the non-luminous region 04 can include a plurality of first connection regions 05. As illustrated here, the non-luminous region 04 can be formed so as to separate a plurality of luminous regions 03 into an array or a matrix. While the connection regions 05 have been illustrated as being embedded within and extending along the length of the non-luminous regions 04, it should be noted, there are no limitations to the positions of the first connection regions 05, as long as the normal function of the OLED substrate will not be influenced. As such, various other configurations are contemplated herein so far as the first connection regions 05 can be provided at a position about or within the non-luminous region 04 separating the plurality of luminous regions 03.

Figure 4A:
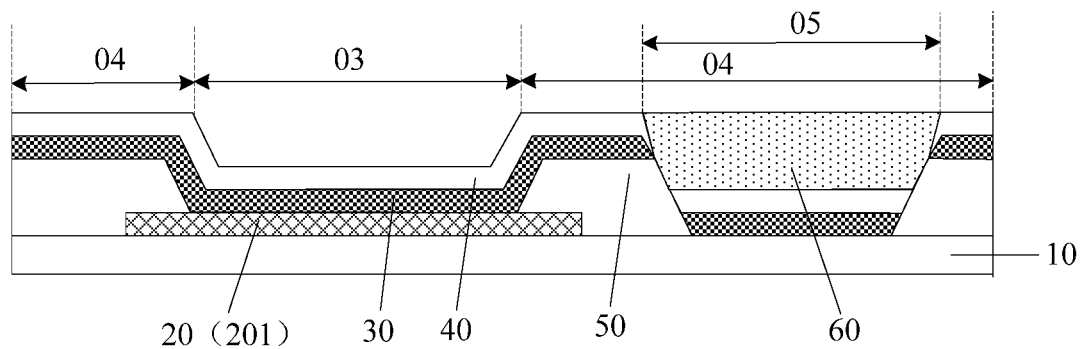
FIG. 4A illustrates a side view of a structural diagram of an OLED substrate according to some embodiments of the present disclosure.
Figure 4B:
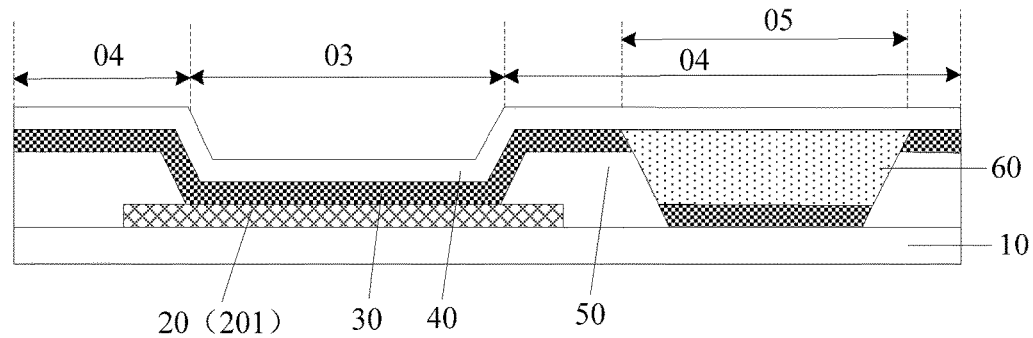
FIG. 4B illustrates another side view a structural diagram of an OLED substrate according to some embodiments of the present disclosure.

FIG. 4A and FIG. 4B illustrate side views of an exemplary structural diagram of an OLED substrate according to some embodiments of the present disclosure.

As illustrate in FIG. 4A and FIG. 4B, the OLED substrate can include a first electrode layer 20, a pixel defining layer (PDL) 50, an electroluminescent functional layer (EL) 30 and a second electrode layer 40. The pixel defining layer 50 can be located at edge portions of the non-luminous region 04.

In this manner, the pixel defining layer 50 can define a plurality of regions in a matrix or an array having a plurality of luminous regions 03 provided therebetween. In other words, the pixel defining layer 50 can include a plurality of aperture regions, wherein an aperture region can correspond to a luminous region 03.

The first electrode layer 20 can then include a plurality of first electrodes 201, for example pixel electrodes, wherein each first electrode 201 can be located in a luminous region 03. In some such embodiments the pixel defining layer 50 can be hollowed out at the first connection regions 05.

The OLED substrate can further include conductive structures 60 provided at or within the first connection regions 05. These conductive structures 60 can be provided at a top side of the electroluminescent functional layer 30, or in other words on a side of the electroluminescent functional layer that is opposite from the base substrate 10. As illustrated here, the conductive structures 60 can be in contact, either directly or indirectly, with the second electrode layer 40.

While those of ordinary skill in the art will recognize there are a multitude of potential material selections which can be utilized for the formation of the base substrate 10, certain advantages have been realized by forming the base substrate from a glass material, however, this substance is mentioned for exemplary purposes only and no limitations to glass are intended by providing this example.

In some embodiments, the first electrode layer 20 can include various anodes, wherein the second electrode layer can include various cathodes. In contrast, in some alternative embodiments, the first electrode layer 20 can instead be provided with various cathodes, while the second electrode layer can include various anodes.

As illustrated herein, and for exemplary purposes only, the material of the first electrode layer 20 can be any one or any combination of Ag (silver), Al (aluminum) or/and ITO (indium tin oxide). However, again, there are no limitations implied in the mention of these exemplary materials, and those having skill in the art will recognize various materials which can be utilized to form the first electrode layer 20. In addition, the first electrode layer 20 can be a single layer structure, however, the first electrode layer 20 can also be a multi-layer stack or wafer structure.

It will also be appreciated that the first electrode layer 20 can be formed utilizing various known processes, and the following recitations with regard to particular steps are made for exemplary purposes only, as such no limitations to the manufacturing processes of the first electrode layer 20 are meant thereby except as outlined by the claims below.

In a first embodiment, the first electrode layer 20 can be formed by utilizing a physical vapor deposition process can be utilized so as to form a single-layer conductive film or multi-layer stack conductive film. Subsequent to such deposition, a photolithography process and an etching process can be utilized to remove a portion of the deposited material so as to form appropriately patterned first electrodes 201.

As illustrated herein, and for exemplary purposes only, the material of the second electrode layer 40 can be any one or any combination of ITO, (indium tin oxide), and IZO (indium zinc oxide). However, again, there are no limitations implied in the mention of these exemplary materials, and those having skill in the art will recognize various materials which can be utilized to form the second electrode layer 40. However, due to the fact that light is intended to be emitted by the electroluminescent functional layer 30 which will emit from the second electrode layer 40, the material of the second electrode layer 40 should be provided as a transparent material.

In some embodiments, the electroluminescent functional layer 30 can include only a single electroluminescent layer. However, in some other embodiments, in addition to the electroluminescent layer, the electroluminescent functional layer 30 can further include at least one, or a plurality, of the following: an electron transporting layer (ETL), an electron injection layer (EIL), a hole transporting layer (HTL), and a hole injection layer (HIL). In some such embodiments, an evaporation process can be utilized to evaporate an electroluminescent functional layer 30 over the pixel defining layer 50.

Similar to above, there are no limitations, explicit or implied, to the manufacturing process of the pixel defining layer 50 as discussed herein, wherein those having ordinary skill in the art will recognize modifications thereto, however, for exemplary purposes only, a pixel defining layer thin film can be formed over the first electrode layer 20, for example, through one of spin-coating process, transfer printing process or ink-jet printing process, then, the pixel defining layer thin film can be patterned through a photolithography process so as to form the pixel defining layer 50 having the proper dimensions and patterns.

With regard to the conductive structures 60, there are no limitations, explicit or implied, to the material of the conductive structures 60, as long as they can be conductive during operation. The material of the conductive structures 60 can be transparent material or non-transparent material because the conductive structures 60 are provided at the first connection regions 05 and the first connection regions 05 are located at the non-luminous region 04.

For illustrative purposes only, the material of the conductive structures 60 can be selected from a group of materials, or a combination thereof, the group including: conductive polymer, metal, conductive silver paste, and conductive resin.

In one example, the conductive structures 60 can be formed at the first connection regions 05 through an ink-jet printing (IJP) process. In yet another example, the conductive structures 60 can be formed at the first connection regions 05 through a silk-screen printing process. However, those of ordinary skill in the art will also recognize various other processes by which the conductive structures 60 can be formed, as such, there are no limitations intended by these exemplary processes for forming the conductive structures 60 about or within the first connection regions 05.

It should be noted, the conductive structures 60 can be located at the side of the electroluminescent functional layer 30 that is opposite from the base substrate 10. In some embodiments, as illustrated in FIG. 4A, the conductive structures 60 can be located at the side of the second electrode layer 40 that is opposite from the electroluminescent functional layer 30. In this case, the second electrode layer 40 can be formed first, then, the conductive structures 60 can be formed thereon.

In some other embodiments, as illustrate in FIG. 4B, the conductive structures 60 can be located between the electroluminescent functional layer 30 and the second electrode layer 40. In this case, the conductive structures 60 can be formed first, then, the second electrode layer 40 can be formed thereon.

In some alternative embodiments, the pixel defining layer 50 can be hollowed out at the first connection regions 05. In other words, the pixel defining layer 50 can be provided with concave portions, i.e. concave drop regions, when providing the electroluminescent functional layer 30 at the first connection regions 05, e.g. inside the concave portions.

In some embodiments, as illustrate in FIG. 4A and FIG. 4B, the electroluminescent functional layer 30 can be disconnected at edges of the first connection regions 05. However, in some other embodiments, the electroluminescent functional layer 30 can be connected at edges of the first connection regions 05.

The larger the depths of the concave portion, the easier the electroluminescent functional layer 30 can be disconnected. As illustrated in FIG. 4A, when the conductive structures 60 are located at the side of the second electrode layer 40 that is opposite from the electroluminescent functional layer 30, the second electrode layer 40 can be disconnected at the edges of the first connection regions 05, the second electrode layer 40 can also be continuous at the edges of the first connection regions 05, e.g., the second electrode layer 40 can also be connected at the edges of the first connection regions 05.

It should be understood that, by providing larger the contact areas between the conductive structures 60 and the second electrode layer 40, a correlating increased advantage is realized in the reduction of resistance of the second electrode layer 40.

According to some embodiments of the present disclosure, a first connection regions 05 can be in the shapes of a strip, similarly, the conductive structures 60 can also be in a corresponding shape of a strip, where, as a result, the contact areas between the conductive structures 60 and the second electrode layer 40 can be maximized therebetween.

Although the pixel defining layer 50 can be hollowed out about the first connection regions 05, because the conductive structures 60 can be provided at the first connection regions 05, there is no need to consider the risk of consecutive difference of the second electrode layer 40 at the first connection regions 05. In this manner, the electric connection between the second electrode layer 40 and the conductive structures 60 can thus be ensured.

The present disclosure provides an OLED substrate, the conductive structures 60 of the OLED substrate can be utilized to reduce the resistance of the second electrode layer 40, and the conductive structures 60 can be in contact with the second electrode layer 40. As a result, the IR-drop problem caused by excessive resistance of the second electrode layer 40 can be solved because the resistance is significantly reduced by the conductive structures 60.

On this basis, compared with the first method in existing technologies, due to the provision of the conductive structures 60, which are equivalent to the auxiliary electrodes 2, which can be provided over the OLED substrate, while the resistance of the second electrode layer 40 can be reduced, the packaging of the OLED substrate will also not be influenced.

Compared with the second method in existing technologies, due to the provision of the conductive structures 60 which can be provided over the second electrode layer 40, or the second electrode layer 40 can be provided over the conductive structures 60, the contact areas between the conductive structures 60 and the second electrode layer 40 can be relatively large.

Due to the increased contact area the resistance of the second electrode layer 40 can be effectively reduced. In addition, the conductive structure 60 can be formed through an IJP process or a silk-screen printing process, a lithography process is not needed, and thus the complexity of the manufacturing process of the OLED substrate will not be increased.

In some embodiments, as illustrated in FIG. 4A and FIG. 4B, the electroluminescent functional layer 30 can be disconnected at the edges of the first connection regions 05. In some such embodiments, the surfaces of the conductive structures 60 that are opposite from the base substrate 10, for example the upper surfaces in the Figures, are higher than the surface of the pixel defining layer 50 that is opposite from the base substrate 10.

It should be noted, when forming the electroluminescent functional layer 30, the electroluminescent functional layer 30 can be disconnected at the edges of the first connection regions 05 only when the depths of the concave drop regions of the first connection regions 05 are sufficiently large.

According to yet additional embodiments of the present disclosure, transverse leakage current caused by the movement of electrons from one sub-pixel, e.g. a luminous region 03, to another sub-pixel can be prevented because the electroluminescent functional layer 30 can be disconnected at the edges of the first connection regions 05. As a result, the interference effect among adjacent sub-pixels can be avoided and the display quality can be improved.

In addition, the thicknesses of the conductive structures 60 provided at the first connection regions 05 can be relatively large since the surfaces of the conductive structures 60 that are opposite from the base substrate 10 can be higher than the surface of the pixel defining layer that is opposite from the base substrate 10. As a result, this large thickness allows for increased ability to reduce the resistance of the second electrode layer 40. Another benefit of this increased thickness is that the flatness of the surface of the OLED substrate can be improved.

Figure 5:
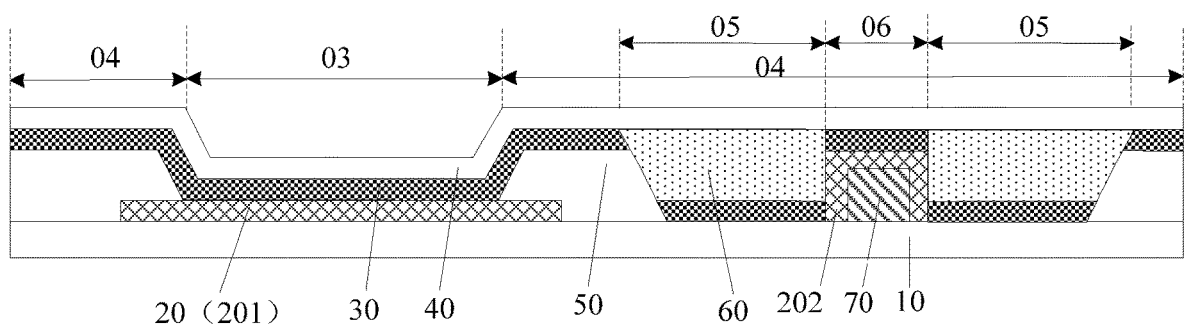
FIG. 5 illustrates a side view of a structural diagram of another OLED substrate according to some other embodiments of the present disclosure.

In some embodiments, as illustrated in FIG. 5, the non-luminous region 04 can further include a plurality of second connection regions 06, as illustrated here, the second connections regions 06 can be adjacent to the first connection regions 05.

The OLED substrate can then further include a plurality of elevating cushions 70 provided at the second connection regions 06, and a plurality of first auxiliary electrodes 202. In this embodiment, a first auxiliary electrode 202 can then be provided which covers the sides of an elevating cushion 70 and the surface of the elevating cushion 70 that is opposite from the base substrate 10, i.e. the upper surface of the elevating cushion. Additionally, a conductive structure 60 can be provided which can be in contact with the portion of a first auxiliary electrode 202 that is located at a side portion of the elevating cushion 70.

A second connection region 06 can then be provided which can be adjacent to a first connection region 05, for example, a second connection region 06 can be surrounded by first connection regions 05. In this case, a conductive structure 60 can be provided continuously to surround the portion of the first auxiliary electrode 202 that is located at the sides, i.e. about a peripheral portion, of the elevating cushion 70.

In another example, the first connection regions 05 can also be located at one side or two sides of the second connection region 06. In this case, the conductive structure(s) 60 can be provided at one side or two sides of the first auxiliary electrode 202 that is located about side portions of the elevating cushion 70.

In some additional embodiments, the elevating cushions 70 can be manufactured simultaneously with the film layers over the OLED substrate, however, the elevating cushions 70 can also be manufactured separately from the film layers over the OLED substrate. Similarly, the first auxiliary electrodes 202 can be manufactured simultaneously with the film layers over the OLED substrate, however, the first auxiliary electrodes 202 can also be manufactured separately from the film layers over the OLED substrate.

In some embodiments, the elevating cushions 70 and the first auxiliary electrodes 202 can be located about the side of the electroluminescent functional layer 30 that is close to the base substrate 10, i.e. the lower surface of the electroluminescent functional layer 30.

In some other embodiments, the elevating cushions 70 and the first auxiliary electrodes 202 can be located between the electroluminescent functional layer 30 and the second electrode layer 40. In yet some other embodiments, the elevating cushions 70 and the first auxiliary electrodes 202 can be located at the side of the second electrode layer 40 that is opposite from the base substrate 10, i.e. the upper surface thereof.

It should be noted that, the conductive structures 60 can be in contact with the sides of the portions of the first auxiliary electrodes 202 located at the anterior sides of the elevator cushions 70. When the elevating cushions 70 and the first auxiliary electrodes 202 are located at the side of the electroluminescent functional layer 30 that is close to the base substrate 10, i.e., the lower surface thereof, particularly when manufacturing the electroluminescent functional layer 30, the electroluminescent functional layer 30 should be disconnected at the edges of the second connection regions 06.

As a result, the portions of the first auxiliary electrodes 202 located at the sides of the elevating cushions 70 can be exposed. In this manner, contact between the conductive structures 60 and the portions of the first auxiliary electrodes 202 that are located at the sides of the elevating cushions can be ensured.

In this manner, an increased contact area between the conductive structure 60 and the portion of the first auxiliary electrode 202 that is located at the sides of the elevating cushion 70, due to the increased height of the elevating cushion 70, and the corresponding larger the area of the portion of the an auxiliary electrode 202 located at the sides of the elevating cushion 70. As a result, the resistance of the second electrode layer 40 can be reduced effectively.

In some additional embodiments, the pixel defining layer 50 can be hollowed out at the second connection regions 06. Conversely, the pixel defining layer can be left intact, or not be hollowed out, at the second connection regions 06. It will be appreciated that FIG. 5 illustrates an instance in which the pixel defining layer 50 is hollowed out at the second connection regions 06.

In some alternative embodiments, the second electrode layer 40 can be disconnected at the edges of the second connection regions 06. In some other embodiments, the second electrode layer 40 can be connected at the edges of the second connection regions 06.

According to some embodiments of the present disclosure, the conductive structures 60 can be in contact with the portions of the first auxiliary electrodes 202 that are located at the sides of the elevating cushions 70 and the conductive structures 60 can be in contact with the second electrode layer 40 because the OLED substrate can further include the first auxiliary electrodes 202 In this embodiment, the contact between the conductive structures 60 and the first auxiliary electrodes causes a situation being equivalent to the situation wherein resistors, i.e., the first auxiliary electrodes 202, are connected in parallel to the second electrode layer 40.

As a result, the resistance of the second electrode layer 40 can be reduced, the IR-drop problem caused by excessive resistance of the second electrode layer 40 can thus be effectively solved.

In some embodiments, the pixel defining layer 50 can be hollowed out at the second connection regions 06. In such embodiments, the first auxiliary electrodes 202 and the first electrodes 201 can be provided at a common layer and made of a common material.

It should be noted, due to the fact that the first auxiliary electrodes 202 and the first electrodes 201 are located at a common layer and made of the same material, the elevating cushions and the first auxiliary electrodes 202 are located at the side of the electroluminescent functional layer 30 that is close to the base substrate 10, i.e., about a bottom surface thereof.

According to some embodiments of the present disclosure, when manufacturing the first electrodes 201, the first auxiliary electrodes 201 that cover the sides of the elevating cushions 70 and the surfaces of the elevating cushions 70 that are opposite from the base substrate 10 can be simultaneously manufactured due to the fact the first auxiliary electrodes 202 and the first electrodes 201 are located at a common layer and made of the same material In contrast, compared with manufacturing the first auxiliary electrodes 202 in a separate process, the manufacturing process of the OLED substrate as contemplated herein can thus be simplified.

Figure 6:
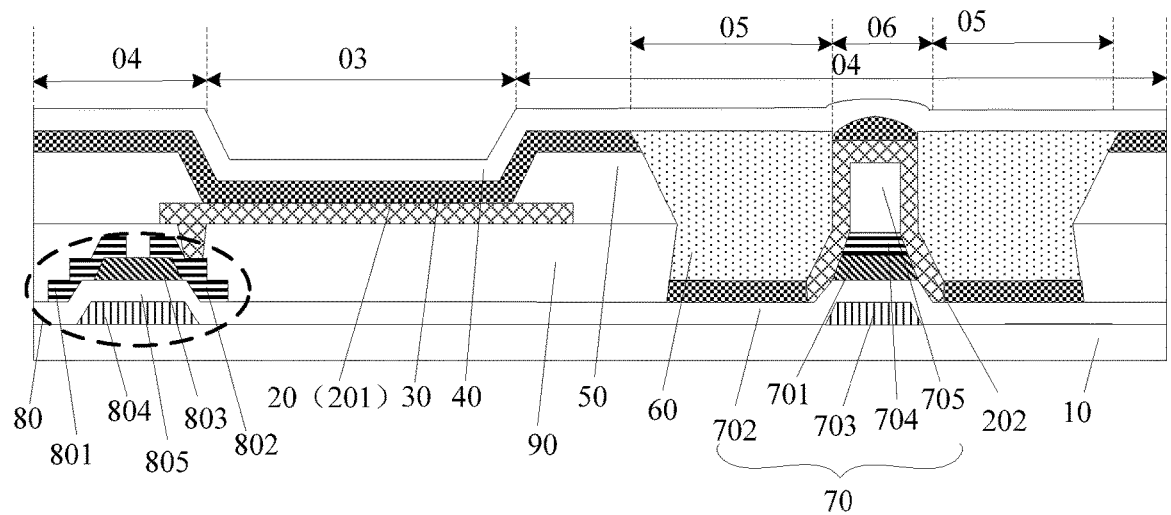
FIG. 6 illustrates a side view of a structural diagram of yet another OLED substrate according to yet some other embodiments of the present disclosure.

In some embodiments, as illustrated in FIG. 6, the OLED substrate can further include a plurality of thin film transistors 80 and a planarization (PLN) layer 90 provided between the thin film transistors 80 and the first electrode layer 20.

In some embodiments, the planarization layer 90 can be hollowed out at the first connection regions 05. In some other embodiments, the planarization layer 90 can be left intact, i.e. not be hollowed out, at the first connection regions 05.

A thin-film transistor (TFT) 80 can then be provided, which includes a source electrode 801, a drain electrode 802, an active layer 803, a gate electrode 804, and a gate insulating layer (GI) 805.

In such embodiments, the drain electrode 802 of a thin film transistor 80 can be electrically connected to a first electrode 201, and the source electrode 801 and the drain electrode 802 of a thin film transistor 80 can be respectively connected to the active layer 803. It should be understood, when there are other film layers between the source electrode 801 and the drain electrode 802 and the active layer 803, the source electrode 801 and the drain electrode 802 can be electrically connected to the active layer 803 through vias or channels provided in or through the film layers.

As illustrated herein, an elevating cushion 70 can include at least one of a first elevating sub-layer 701, a second elevating sub-layer 702, a third elevating sub-layer 703, a fourth elevating sub-layer 704, and a fifth elevating sub-layer 705.

The first elevating sub-layer 701, the second elevating sub-layer 702, the third elevating sub-layer 703, the fourth elevating sub-layer 704, and the fifth elevating sub-layer 705 can be arranged in stacked layers, e.g., when where are more than one elevating sub-layer, the elevating sub-layers are arranged in stacked layers, i.e. as a wafer.

In some such embodiments, the stacked layer construction allows for an increase in the height of an elevating cushion 70, in this manner, the distance between the first auxiliary electrode 202 formed over the elevating cushion 70 and the bottom of the elevating cushion 70 can be increased. As such, the area of the portion of the first auxiliary electrode 202 located at the side of the elevating cushion 70 can be increased.

This increased height allows for the contact area between the conductive structure 60 and the first auxiliary electrode 202 to be increased, which contact area allows for reduced resistance and a corresponding reduction or solving of the IR-drop problem discussed above.

In yet additional embodiments, the first elevating sub-layers 701 of elevating cushions 70 and the active layer 803 can be provided at a common layer and made of the same material.

In such embodiments, the portions of the gate insulating layer 805 that are located at the second connection regions 06 can form the second elevating sub-layers 702 of the elevating cushions 70.

Additionally, in such embodiments, the third elevating sub-layers 703 of the elevating cushions 70 and the gate electrodes 804 can be provided at a common layer and made of the same material.

Similarly, the fourth elevating sub-layers 704 of the elevating cushions 70 and the source electrodes 801 and the drain electrodes 802 can be provided at a common layer and made of the same material. Similarly, the portions of the planarization layer 90 located at the second connection regions 06 can form the fifth elevating sub-layers 705 of the elevating cushions 70.

In some embodiments, the first elevating sub-layers 701 of the elevating cushions 70 can be manufactured simultaneously when the active layer 803 is manufactured, because the first elevating sub-layers 701 of the elevating cushions 70 and the active layer 803 are located at a common layer and made of the same material.

As a result, the manufacturing process of the OLED substrate can be simplified.

Again, the following methods of manufacturing the elevating sub-layers and the active sublayer are included for exemplary purposes only, and as such, there are no limitations to the manufacturing process of the first elevating sub-layers 701 of the elevating cushions 70 and the active layer 803.

In some embodiments, the manufacturing method can include a first step of: forming a semiconductor thin film layer through a physical vapor deposition (PVD) process over the base substrate 10; a second step of: patterning the semiconductor thin film through a photolithography process; and a third step of: implementing an etching process to form the active layer 803 and the first elevating sub-layers 701 of the elevating cushions 70 at the same time.

In some embodiments, the material of the semiconductor thin film can be IGZO (Indium Gallium Zinc Oxide).

It should be noted that, in some embodiments, the gate insulating layer 805 can be hollowed out at the first connection regions 05. In some other embodiments, the gate insulating layer 805 can be left intact, i.e. not hollowed out, at the first connection regions 05.

In other words, the gate insulating layer 805 can be continuous at the first connection regions 05.

In some embodiments, as illustrate in FIG. 6, the gate insulating layer 805 can also be left intact or whole, i.e. not be hollowed out at the first connection regions 05, in order to prevent the impurities in the base substrate 10 to be spread to the film layers provided over the base substrate 10 and influence the normal display of the OLED substrate.

For the embodiments illustrated herein, there is no need to manufacture the second elevating sub-layers 702 of the elevating cushions 70 separately because the portions of the gate insulating layer 805 which are located at the second connection regions 06 can simultaneously form the second elevating sub-layers 702 of the elevating cushions 70.

In this manner, the manufacturing process of the OLED substrate can be simplified. In this embodiment, the gate insulating layer 805 can be formed though a chemical vapor deposition (CVD) process or a plasma enhanced chemical vapor deposition (PECVD) process. The material of the gate insulating layer 805 can be at least one of $SiO_x$ (silicon oxide), $SiN_x$ (silicon nitride) and $SiO_xN_y$ (silicon oxynitride).

The gate insulating layer 805 can also be a stacked structure formed by at least two of a $SiO_x$ layer, a $SiN_x$ layer and a $SiO_xN_y$ layer. However, these specific processes and materials are mentioned for exemplary purposes only and as such are not intended to be limiting either explicitly or implicitly, except as limited in the claims below, as those having skill in the art will also recognize alternative methods and materials which would be suitable for these applications.

In some additional embodiments, the third elevating sub-layers 703 can be manufactured concurrently with the gate electrodes 804 because the third elevating sub-layers 703 of the elevating cushions 70 and the gate electrodes 804 are located at a common layer and made of the same material.

As a result, the manufacturing process of the OLED substrate can be simplified. In some embodiments, a first manufacturing step can be implemented, which can include: forming a first conductive thin film through a PVD film formation technique, then a second step can include: patterning the first conductive thin film through a mask etching process. In this manner, the gate electrodes 804 and the third elevating sub-layers 703 of the elevating cushions 70 can be formed simultaneously. In some such embodiments, the material of the first conductive thin film can be at least one of Al (aluminum), Mo (molybdenum), Cu (copper) and Ti (titanium).

However, these specific processes and materials are mentioned for exemplary purposes only and as such are not intended to be limiting either explicitly or implicitly, except as claimed in the claims below, as those having skill in the art will also recognize alternative methods and materials which would be suitable for these applications.

Figure 7:
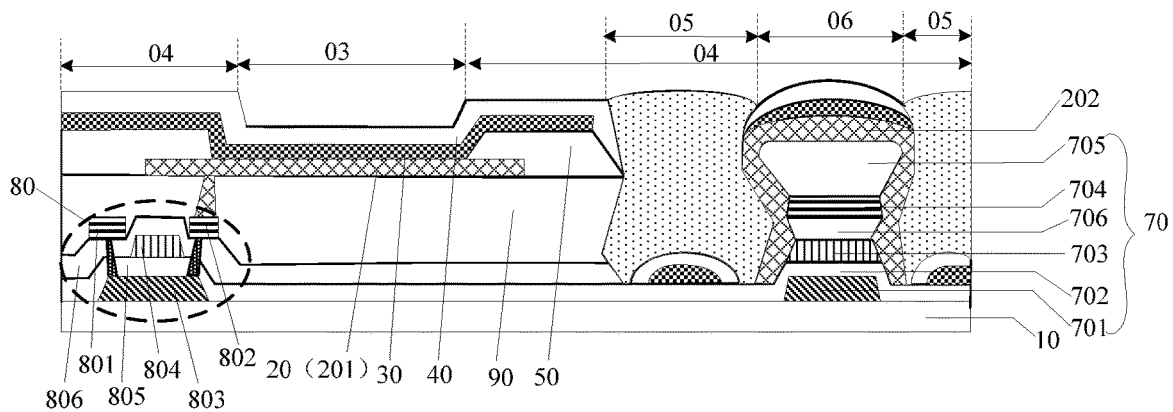
FIG. 7 illustrates a side view of a structural diagram of yet another OLED substrate according to yet some other embodiments of the present disclosure.

In some embodiments, as illustrated in FIG. 7, the side of the third elevating sub-layer 703 of an elevating cushion 70 can be in contact with the first auxiliary electrode 202.

In some other embodiments, as illustrated in FIG. 6, the side of the third elevating sub-layer 703 of an elevating cushion 70 can be separated from, or otherwise disconnected from the first auxiliary electrode 202.

In case the side of the third elevating sub-layer 703 of an elevating cushion 70 is in contact with the first auxiliary electrode 202, the third elevating sub-layer 703 can be equivalent to a second auxiliary electrode. This configuration can reduce the resistance of the second electrode layer 40, which is beneficial for further improving the IR-drop problem caused by excessive resistance of the second electrode layer 40.

In yet additional embodiments, the fourth elevating sub-layers 704 of the elevating cushions 70 and the source electrodes 801 and the drain electrodes 802 can be manufactured simultaneously because the fourth elevating sub-layers 704 of the elevating cushions 70 and the source electrodes 801 and the drain electrodes 802 can be provided at a common layer and made of the same material.

As a result, the manufacturing process of the OLED substrate can be simplified. In some embodiments, a first manufacturing step is contemplated in which: a second conductive thin film layer can be formed through e.g. a PVD process, then a second step can include the step of: patterning the second conductive film through a photolithography process or an etching process to form the source electrodes 801 and the drain electrodes 802 (e.g. S/D electrode).

The material of the second conductive thin film can be at least one of AL, Mo, CU and Ti. However, these specific processes and materials are mentioned for exemplary purposes only and as such are not intended to be limiting either explicitly or implicitly, except as claimed in the claims below, as those having skill in the art will also recognize alternative methods and materials which would be suitable for these applications.

In some embodiments, the side of the fourth elevating sub-layer 704 of an elevating cushion 70 can be in contact with a first auxiliary electrode 202. In some other embodiments, the side of the fourth elevating sub-layer 704 of an elevating cushion 70 can be disconnected from, or not in contact with, a first auxiliary electrode 202.

In yet additional embodiments, the side of the fourth elevating sub-layer 704 of an elevating cushion 70 can be in contact with the first auxiliary electrode 202, wherein the fourth elevating sub-layer 704 can be equivalent to a third auxiliary electrode. In this manner, this connection can reduce the resistance of the second electrode layer 40, and thus is beneficial for further improving the IR-drop problem caused by excessive resistance of the second electrode layer 40.

In some embodiments, there is no need to manufacture the fifth elevating sub-layers 705 of the elevating cushions 70 separately because the portions of the planarization layer 90 that are located at the second connection regions 06 can also be utilized so as to form the fifth elevating sub-layers 705 of the elevating cushions 70. In this manner, the manufacturing process of the OLED substrate can be simplified.

A process of forming such can include a first step of: spin-coating a planarization layer thin film; a second step of: transfer printing process and/or an ink-jet printing process; then a third step of: patterning the planarization layer thin film to form the planarization layer 90.

In some such embodiments, the planarization layer can be utilized to flatten and provide a planarized surface for the subsequent manufacturing of the first electrode layer 20.

According to some embodiments of the present disclosure, all elevating sub-layers of the elevating cushions 70 can be manufactured at the time when the thin film transistors 80 are manufactured, because there is no need to manufacture the elevating cushions 70 separately, which combination of processes can simplify the manufacturing process of the OLED substrate.

On this basis, in the case wherein the sides of the third elevating sub-layers 703 of the elevating cushions 70 are in contact with the first auxiliary electrodes 202, or the sides of the fourth elevating sub-layers 704 of the elevating cushions 70 are in contact with the first auxiliary electrodes 202, the third elevating sub-layers 703 of the elevating cushions 70 and the fourth elevating sub-layers 704 of the elevating cushions 70 can also be utilized as auxiliary electrodes. These structures are then equivalent to resistors which are connected in parallel to second electrode layer 40.

As a result, the resistance of the second electrode layer 40 can further be reduced, which is correspondingly beneficial for solving the IR-drop problem caused by excessive resistance of the second electrode layer 40.

In addition, under the first auxiliary electrodes 202 the heights of the elevating cushions 70 can be increased, because each elevating sub-layer of an elevating cushion 70 and the corresponding layer of a thin film transistor 80 can be manufactured at a common layer.

As a result, the contact areas between the conductive structures 60 and the first auxiliary electrodes 202 can be increased, which is correspondingly beneficial for solving the IR-drop problem.

In some embodiments, when manufacturing the active layer 803 of the thin film transistor 80 and a third electrode. In such a case, when manufacturing the gate electrode 804 of the thin film transistor 80, a fourth electrode can be manufactured, the third electrode and the fourth electrode can be provided facing each other to form a storage capacitor (Cst).

According to embodiments of the present disclosure, if the side of the fifth elevating sub-layer 705 and the surface of the fifth elevating sub-layer 705 that is close or proximal to the second electrode layer 40 forms an acute angle, when forming the first auxiliary electrode 202, the first auxiliary electrode 202 can be easily broken at the position of this acute angle because a first auxiliary electrode 202 are formed over a fifth elevating sub-layer 705 of an elevating cushion 70.

As a result, the portion of the first auxiliary electrode 202 that is located at the surface of the fifth elevating sub-layer 705 that is opposite to the base substrate 10 cannot be electrically connected to the conductive structure 60, for this reason, this arrangement is not beneficial for reducing the resistance of the second electrode layer 40.

In order to prevent the abovementioned problem, in some embodiments, as illustrated in FIG. 6 and FIG. 7, the side of the fifth elevating sub-layer 705 of an elevating cushion 70 and the surface of the fifth elevating sub-layer 705 of an elevating cushion 70 that is close to the second electrode layer 40, e.g. the upper surface in the Figures, can be connected to each other through an arc segment.

In some such embodiments, during the manufacturing process of the planarization layer 90, the method for realizing the connection of the side of the fifth elevating sub-layer 705 and the surface of the fifth elevating sub-layer 705 that is close or proximal to the second electrode layer 40 through an arc segment can be achieved by controlling various factors during manufacturing.

Such factors can include: providing composition variations at different positions of different thickness of the planarization layer thin film during the deposition process of the planarization layer thin film, the angle of the light during the photolithography process, the strength of the light at different positions, and the distance between the mask and the planarization layer thin film.

In order for the electroluminescent functional layer 30 to be disconnected at the edges of the second connection regions 06, in some embodiments, the side of the fifth elevating sub-layer 705 of an elevating cushion 70 can be an inclined plane, wherein the areas of the surfaces of the fifth elevating sub-layers 705 of the elevating cushions 70 that are close to the second electrode layer 40 can be larger than or equal to the areas of the surfaces of the fifth elevating sub-layers 705 of the elevating cushions 70 that are opposite from the second electrode layer 40. In some such embodiments, the planarization layer 90 can be manufactured with negative photoresist, e.g. negative photoresist polymer, which, as a result, the negative photoresist that the amount of light will be gradually decreased as the thickness of the film is increased.

In some such embodiments, the fifth elevating sub-layers 705 of the elevating cushions 70 can be manufactured at the portions of the planarization layer 90 that are located at the second connection regions 06 through a photolithography process and a development process. In this manner, the areas of the surfaces of the fifth elevating sub-layers 705 of the elevating cushions 70 that are close to the second electrode layer 40 can be larger than or equal to the area of the surfaces of the fifth elevating sub-layers 705 of the elevating cushions 70 that are opposite from the second electrode layer 40.

In some embodiments, as illustrated in FIG. 7, the thin film transistors 80 can further include an inter-layer dielectric (ILD) layer 806; wherein the inter-layer dielectric layer 806 can be hollowed out at the first connection regions 05. The portions of the inter-layer dielectric layer 806 located at the second connection regions 06 can form the sixth elevating sub-layers 706 of the elevating cushions 70.

In some embodiments, the inter-layer dielectric layer thin film can be deposited through a CVD process, the inter-layer dielectric layer 806 can be formed through patterning the inter-layer dielectric layer thin film. There are no limitations to the material of the inter-layer dielectric layer 806, wherein the inter-layer dielectric layer 806 can be at least one of $SiO_x$, $SiN_x$ and $SiO_xN_y$.

According to embodiments of the present disclosure there is no need to manufacture the sixth elevating sub-layers 706 of the elevating cushions 70 separately because the portions of the inter-layer dielectric layer 806 that are located at the second connection region 06 can form the sixth elevating sub-layers 706 of the elevating cushions 70. As such, the manufacturing process of the OLED substrate can thus be simplified.

In addition, the heights of the elevating cushions 70 can be increased such that the areas of the first auxiliary electrodes 202 that are located at the sides of the elevating cushions 70 can be increased because the portions of the inter-layer dielectric layer 806 that are located at the second connection regions 06 can be utilized as the sixth elevating sub-layers 706 of the elevating cushions 70. In this manner, the contact areas between the conductive structures 60 and the first auxiliary electrodes 202 can be increased.

In some embodiments, as illustrated in FIG. 7, the side of the sixth elevating sub-layer 706 of an elevating cushion 70 can be an inclined plane, wherein the areas of the surfaces of the sixth elevating sub-layers 706 of the elevating cushions 70 that are close to the second electrode layer, e.g. the upper surfaces in FIG. 7, can be larger than the areas of the surfaces of the sixth elevating sub-layers 706 of the elevating cushions 70 that are opposite from the second electrode layer, e.g. the lower surfaces in the Figure.

In other words, in some embodiments, after cutting out the sixth elevating sub-layer 706 of an elevating cushion 70 along the direction of the thickness of the sixth elevating sub-layer 706, a cross-section in the shape of an inverse ladder can be obtained.

There are no limitations to the manufacturing method of the sixth elevating sub-layer 706, as long as the abovementioned shape of the sixth elevating sub-layer 706 can be formed. In the following, two specific implementations of the manufacturing method of the sixth elevating sub-layer 706 will be described in detail.

The first method can include the following processes. The material of the inter-layer dielectric layer 806 can be $SiO_xN_y$. During the process of forming the inter-layer dielectric layer thin film, the inter-layer dielectric layer thin film can have a gradient distribution of composition through controlling the process conditions such as gas flow ratio, reaction barometric pressure during the thin film deposition process, e.g., the composition of the bottom layer can be $SiO_x$, for example, $SiO_2$, at the bottom of the thin film, in the direction from the bottom to the top of the thin film, the content of N can be increased gradually and the content of O can be decreased gradually, the composition of the top layer of the thin film can be $SiO_x$(for example, $SiO_2$).

The densification of the thin film formed in this manner can be increased gradually from the bottom of the film to the top of the film. As a result, when patterning the inter-layer dielectric layer thin film to form the inter-layer dielectric layer 806. Then, during the etching process, the etching rate can be decreased gradually from the bottom to the top. In this manner, an inverse ladder structure can be formed at a second connection region 06.

The second method includes the following: wherein the material of the inter-layer dielectric layer 806 is $SiN_x$; during the process of forming the inter-layer dielectric layer thin film, the composition of the thin film can be controlled and adjusted through controlling the gas flow ratio during the thin film deposition process, that is, the content of Si can be increased gradually from the bottom of the film to the top of the film.

As a result, the densification of the thin film can be increased gradually from the bottom of the film to the top of the film. As a result, when patterning the inter-layer dielectric layer thin film to form the inter-layer dielectric layer 806, during the etching process, the etching rate can be decreased gradually from the bottom to the top. In this manner, an inverse ladder structure can be formed at a second connection region 06.

In some embodiments, the source electrode can include one or more contact holes, i.e. vias or channels, and one or more drain electrode contact holes, i.e. vias or channels, as illustrated in FIG. 7 which can be formed over the inter-layer dielectric layer 806 utilizing a photolithography process and/or an etching process.

According to embodiments of the present disclosure, when forming the electroluminescent functional layer 30, it is beneficial for disconnecting the electroluminescent functional layer 30 at the edges of the second connection regions 06 because the sides of the sixth elevating sub-layers 706 of the elevating cushions 70 are inclined planes, and the areas of the surfaces of the sixth elevating sub-layers 706 of the elevating cushions 70 that are close to the second electrode layer 40 can be larger than the areas of the surfaces of the sixth elevating sub-layers 706 of the elevating cushions 70 that are opposite from the second electrode layer 40.

As a result, the portions of the first auxiliary electrodes 202 that are located at the sides of the elevating cushions 70 can be in contact with the conductive structures 60.

Figure 8A:
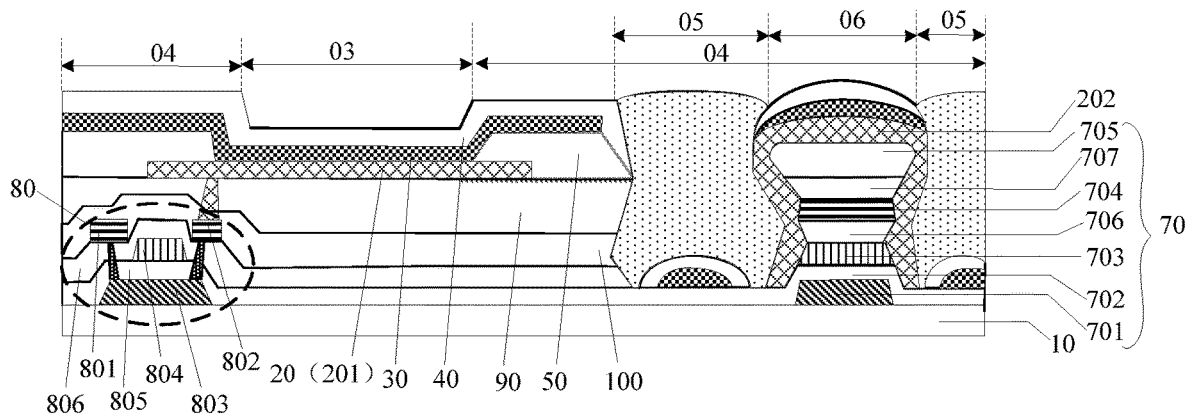
FIG. 8A illustrates a side view of a structural diagram of yet another OLED substrate according to yet some other embodiments of the present disclosure.
Figure 8B:
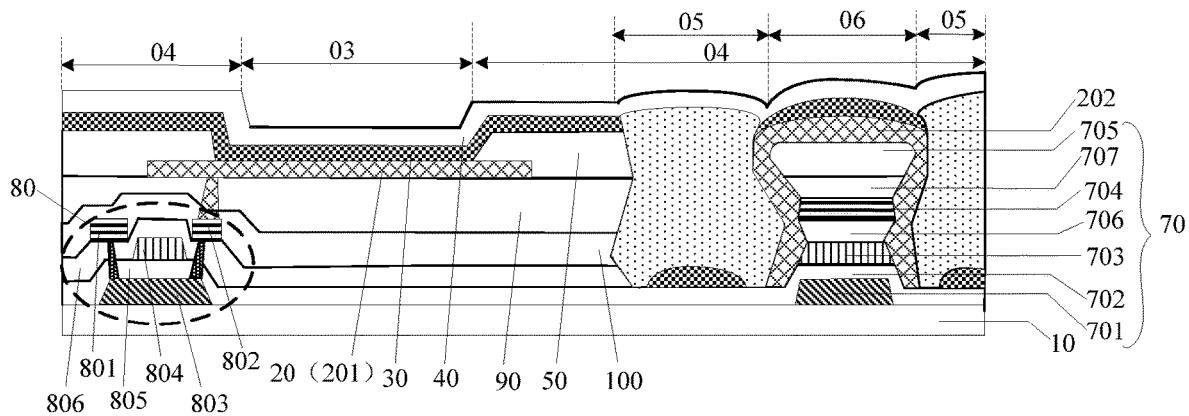
FIG. 8B illustrates another side view of a structural diagram of yet another OLED substrate according to yet some other embodiments of the present disclosure.

In some embodiments, as illustrated in FIG. 8A and FIG. 8B, the OLED substrate can further include a passivation layer (PV) 100 provided between the thin film transistors 80 and the planarization layer 90; wherein the portions of the passivation layer 100 that are located at the second connection regions 06 can form the seventh elevating sub-layers 707 of the elevating cushions 70.

In some such embodiments, the passivation layer 100 can be deposited through a CVD process. There are no limitations to the material of the passivation layer 100, wherein the passivation layer 100 can be formed using at least one of $SiO_x$, $SiN_x$ and $SiO_xN_y$.

In some embodiments, the passivation layer 100 can be hollowed out at the first connection regions 05. In some other embodiments, the passivation layer 100 can be left intact, or otherwise not be hollowed out, at the first connection regions 05.

According to some embodiments of the present disclosure, the passivation layer 100 can be provided between the thin film transistors 80 and the planarization layer 90 can thus prevent any interference effect between the thin film transistors 80 and the self-luminous components, i.e. the self-luminous components can include the first electrode layer 20, the electroluminescent functional layer 30, and the second electrode layer 40. In addition, the portions of the passivation layer 100 located at the second connection regions 06 can form the seventh elevating sub-layers 707 of the elevating cushions 70.

As a result, there is no need to manufacture the seventh elevating sub-layers 707 separately, and the manufacturing process of the OLED substrate can thus be simplified. On this basis, the portions of the passivation layer 100 located at the second connection regions 06 can be utilized as the seventh elevating sub-layers 707, and the heights of the elevating cushions 70 can thus be increased. As a result, the areas of the first auxiliary electrodes 202 that are located at the sides of the elevating cushions 70 can be increased, which, as a result, allows for the contact areas between the conductive structures 60 and the first auxiliary electrodes 202 to be increased.

In some embodiments, as illustrated in FIG. 8A and FIG. 8B, the sides of the seventh elevating sub-layers 707 of the elevating cushions 70 can be inclined planes, wherein the areas of the surfaces of the seventh elevating sub-layers 707 of the elevating cushions 70 that are close to the second electrode layer 40 can be larger than the areas of the surfaces of the sixth elevating sub-layers 707 of the elevating cushions 70 that are opposite from the second electrode layer 40.

In other words, in some embodiments, after cutting out a seventh elevating sub-layer 707 along the direction of the thickness of the seventh elevating sub-layer 707, a cross-section in the shape of an inverse ladder can be obtained.

There are no limitations to the manufacturing method of the seventh elevating sub-layers 707 of the elevating cushions 70, as long as the abovementioned shapes of the seventh elevating sub-layers 707 can be formed. The manufacturing method of the seventh elevating sub-layers 707 of the elevating cushions 79 can be the same as the manufacturing method of the sixth elevating sub-layers 706 of the elevating cushions 70 described above, because the manufacturing method of the sixth elevating sub-layers 706 of the elevating cushions 70 has been described above in detail, it will not be repeated herein.

According to embodiments of the present disclosure, because the sides of the seventh elevating sub-layers 707 of the elevating cushions 70 are inclined planes, and the areas of the surfaces of the seventh elevating sub-layers 707 of the elevating cushions 70 that are close to the second electrode layer 40 can be larger than the areas of the surfaces of the seventh elevating sub-layers 707 of the elevating cushions 70 that are opposite from the second electrode layer 40, when forming the electroluminescent functional layer 30, it is beneficial for disconnecting the electroluminescent functional layer 30 at the edges of the second connection regions 06.

As a result, the portions of the first auxiliary electrodes 202 that are located at the sides of the elevating cushions 70 can be in contact with the conductive structures 60.

The material of the passivation layer 100 and/or the inter-layer dielectric layer 806 can be at least one of $SiO_x$, $SiN_x$, and $SiO_xN_y$. Additionally, as has been recognized, a film layer formed by $SiO_x$, $SiN_x$, or $SiO_xN_y$ can have shortcomings such as bumps and microcracks in the film layer. As a result, when forming the elevating sub-layers of the elevating cushions 70 at the portions of the passivation layer 100 and/or the inter-layer dielectric layer 806 located at the second connection regions 06, the surfaces of the elevating sub-layers may not be flat.

Additionally, shortcomings such as nonuniformity or cracks within the first auxiliary electrodes 202 can be realized when forming the first auxiliary electrodes 202 at the sides of the elevating cushions 70 and the surfaces of the elevating cushions 70 that are opposite from the base substrate 10.

In order to solve the abovementioned problems, in some embodiments, a dense and uniform $Al_2O_3$ film layer can be formed at the sides of at least one of the sixth elevating sub-layers 706 of the elevating cushions 70 or the seventh elevating sub-layers 707 of the elevating cushions 70.

In some instances, the $Al_2O_3$ film layer can also be formed at the sides of the fifth elevating sub-layer 705 of the elevating cushions 70 and the surfaces of the fifth elevating sub-layers 705 of the elevating cushions 70 that are opposite from the base substrate 10.

In such instances, the nonuniformity or cracks that can occur during the formation of the first auxiliary electrodes 202 can be prevented because the $Al_2O_3$ film layer can have a flat and smooth surface which can cover the film layer formed by $SiO_x$, $SiN_x$, or $SiO_xN_y$, and provide a flat and smooth surface for the formation of the first auxiliary electrodes 202. In this manner, the problem of IR-drop of the second electrode layer 40 can be effectively improved.

Figure 9:
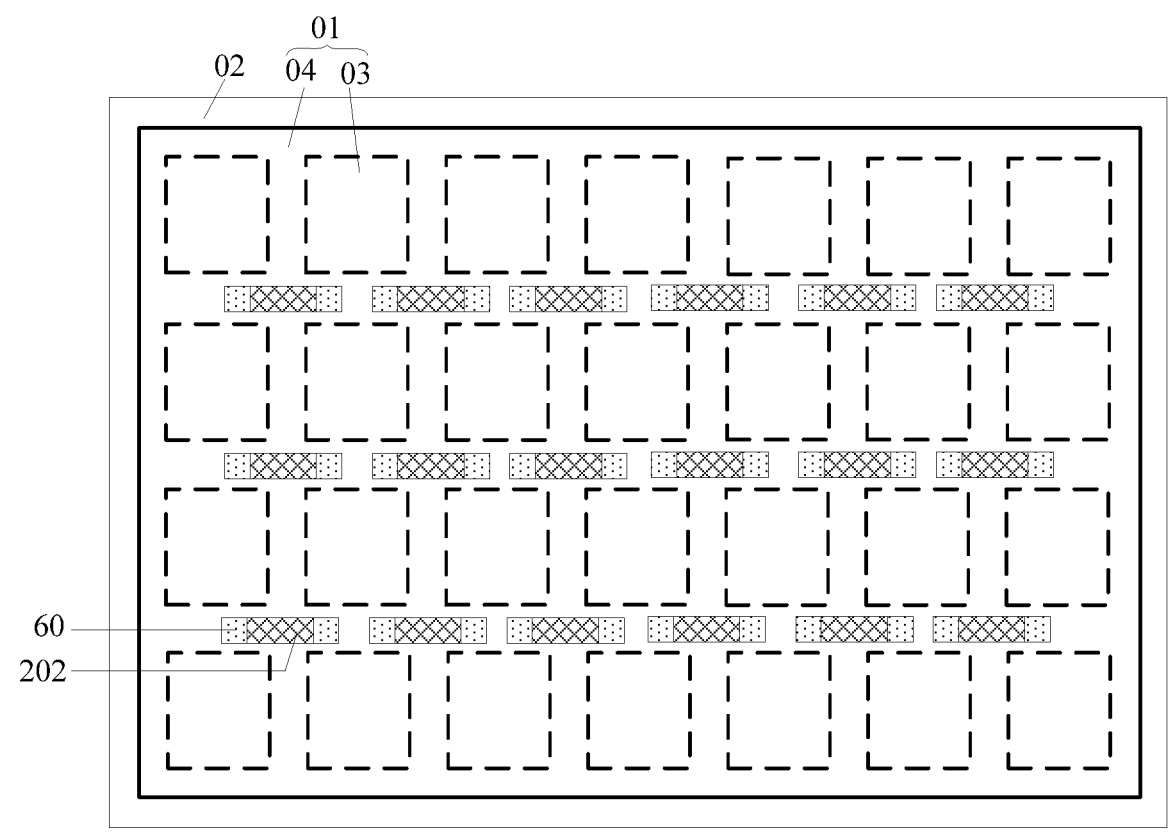
FIG. 9 illustrates a top view of a structural diagram of an OLED substrate according to some embodiments of the present disclosure.
Figure 10A:
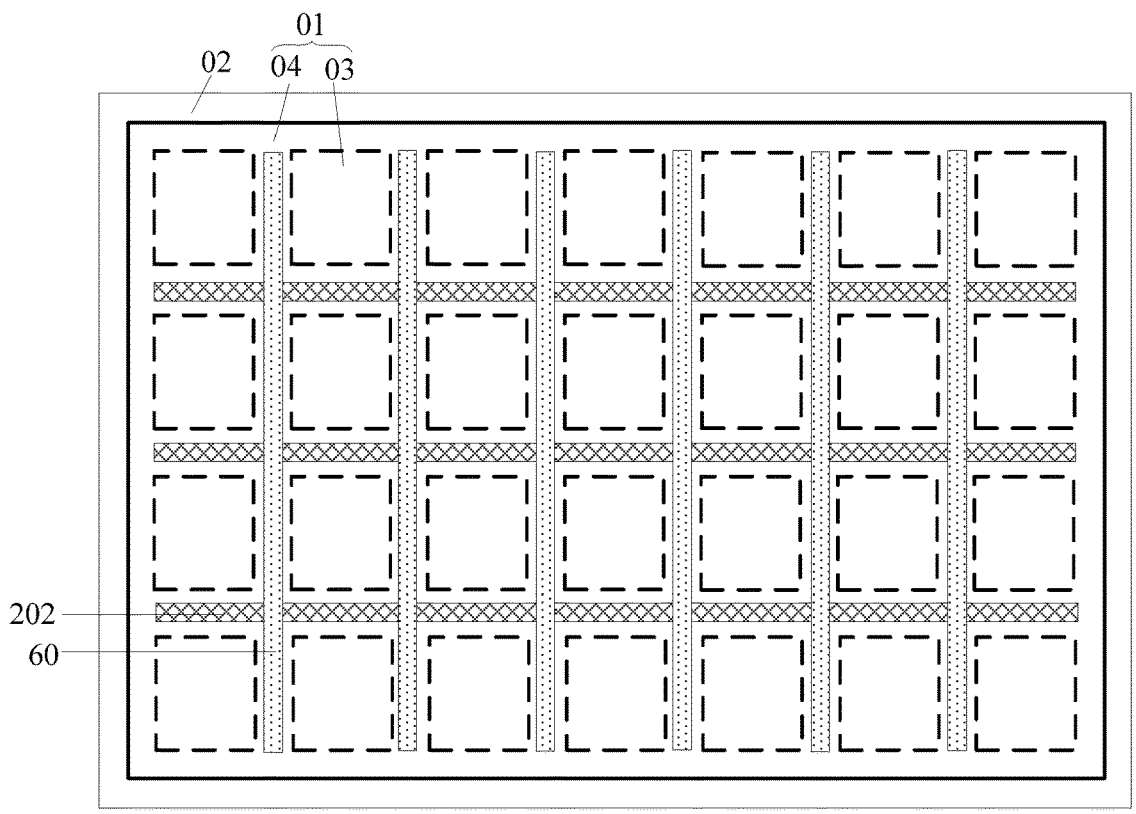
FIG. 10A illustrates a top view of a structural diagram of another OLED substrate according to some other embodiments of the present disclosure.
Figure 10B:
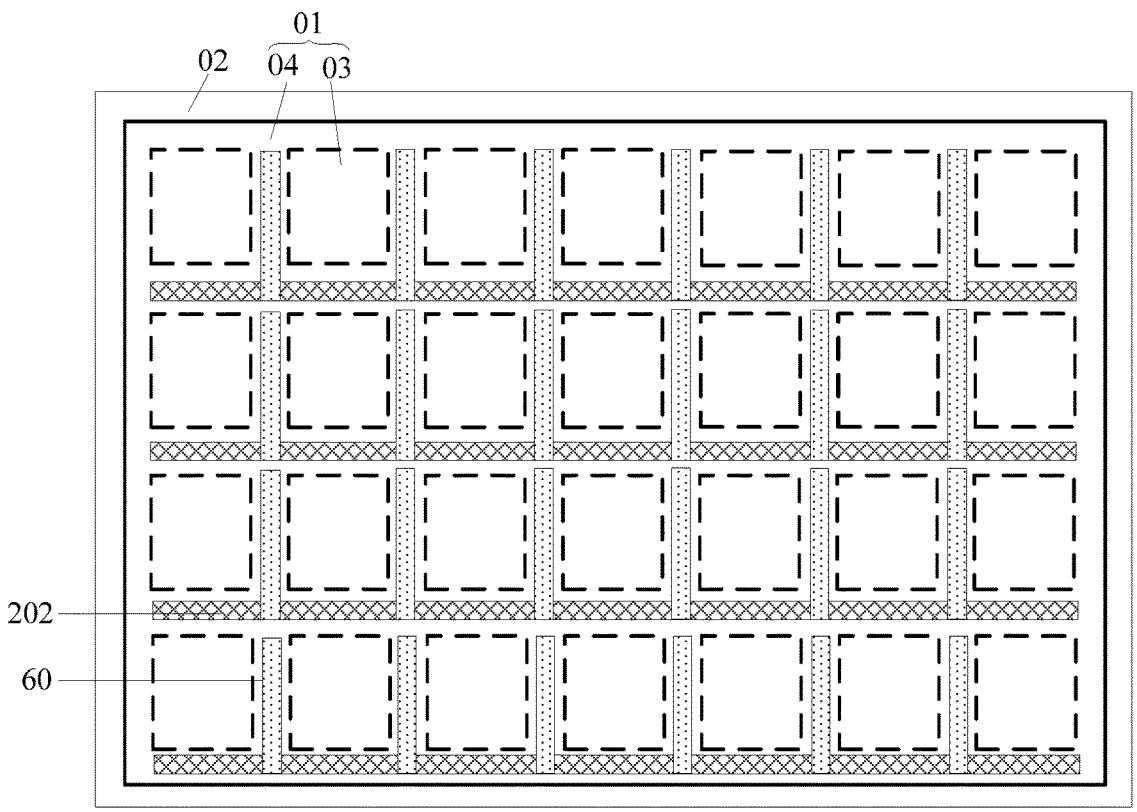
FIG. 10B illustrates a top view of a structural diagram of yet another OLED substrate according to yet some other embodiments of the present disclosure.

In some embodiments, as illustrated in FIG. 9, FIG. 10A, and FIG. 10B, a plurality of conductive structures 60 can be provided; wherein the conductive structures 60 can be provided at the two sides of an elevating cushion 70. In this manner, the portion of a first auxiliary electrode 202 that is located at the side of an elevating cushion 70 can be respectively in contact with the conductive structures 60 that are provided at two sides of an elevating cushion 70.

In some embodiments, the conductive structures 60 can be provided according to practical needs and there are no limitations to the number and positions of the conductive structures 60. Further, as recognized, the larger the contact areas between the conductive structures 60 and the second electrode layer 40, the more advantageous for reducing the resistance of the second electrode layer 40.

According to embodiments of the present disclosure, the portion of the first auxiliary electrode 202 that is located at the side of an elevating cushion 70 can have a larger contact area with the conductive structures 60 because the conductive structures 60 are provided at two sides of each elevating cushion 70, which then allows for the resistance of the second electrode layer 40 to be effectively reduced.

In some embodiments, as illustrated in FIG. 10A and FIG. 10B, the shapes of the conductive structures 60 can be provided as strips extending in a direction that is parallel to any associated side of the base substrate.

It should be noted that, when the shapes of the conductive structures 60 are strips extending in a direction that is parallel to any side of the base substrate 10, the shape of a conductive structure 60 can be an unbroken, or whole, strip as illustrated in FIG. 10A, a conductive structure 60 can also be composed of a plurality of strip-shaped sub-conductive structures that are disconnected from one another.

As illustrated in FIG. 10A, if the shapes of the conductive structures 60 are unbroken or whole strips extending in the direction parallel to any side of the base substrate 10, in order to prevent the conductive structures 60 from overlapping or crossing the gate lines or data lines over the OLED substrate, in some embodiments, the planarization layer 90 and/or the passivation layer 100 will not be hollowed out at the first connection regions 05, the planarization layer 90 and/or the passivation layer 100 can thus be separate from the conductive structure 60 and the gate lines or data lines over the OLED substrate. In this case, the conductive structures 60 can be formed through a silk-screen printing process.

As illustrated in FIG. 10B, if a conductive structures 60 are composed of a plurality of strip-shaped sub-conductive structures that are disconnected from one another in the direction parallel to any side of the base substrate 10, because the conductive structures 60 will not overlap with or cross the gate lines and data lines over the OLED substrate, the planarization layer 90 and/or the passivation layer 100 can be hollowed out at the first connection regions 05.

As a result, the thicknesses of the conductive structures 60 provided at the first connection regions 05 can be increased. In this case, the conductive structure 60 can be formed through an ink-jet printing process.

In some other embodiments, as illustrated in FIG. 9, the shapes of the conductive structures 60 can be points. In this case, the conductive structures 60 can be formed through an ink-jet printing process.

As illustrated in FIG. 9, the conductive structure 60 can be provided such that they will not overlap with or cross the data lines and gate lines provided over the OLED substrate because the shapes of the conductive structures 60 are points. As a result, the planarization layer 90 and/or the passivation layer 100 can be hollowed out at the first connection regions 05, which allows for the thickness of the conductive structures 60 provided at the first connection regions 05 to be increased.

On this basis, when the elevating cushions 70 include the third elevating sub-layers 703, the third elevating sub-layers 703 of the elevating cushions 70 can be provided as strips parallel to the gate lines, and the third elevating sub-layers 703 can be insulated from the gate lines.

Figure 11:
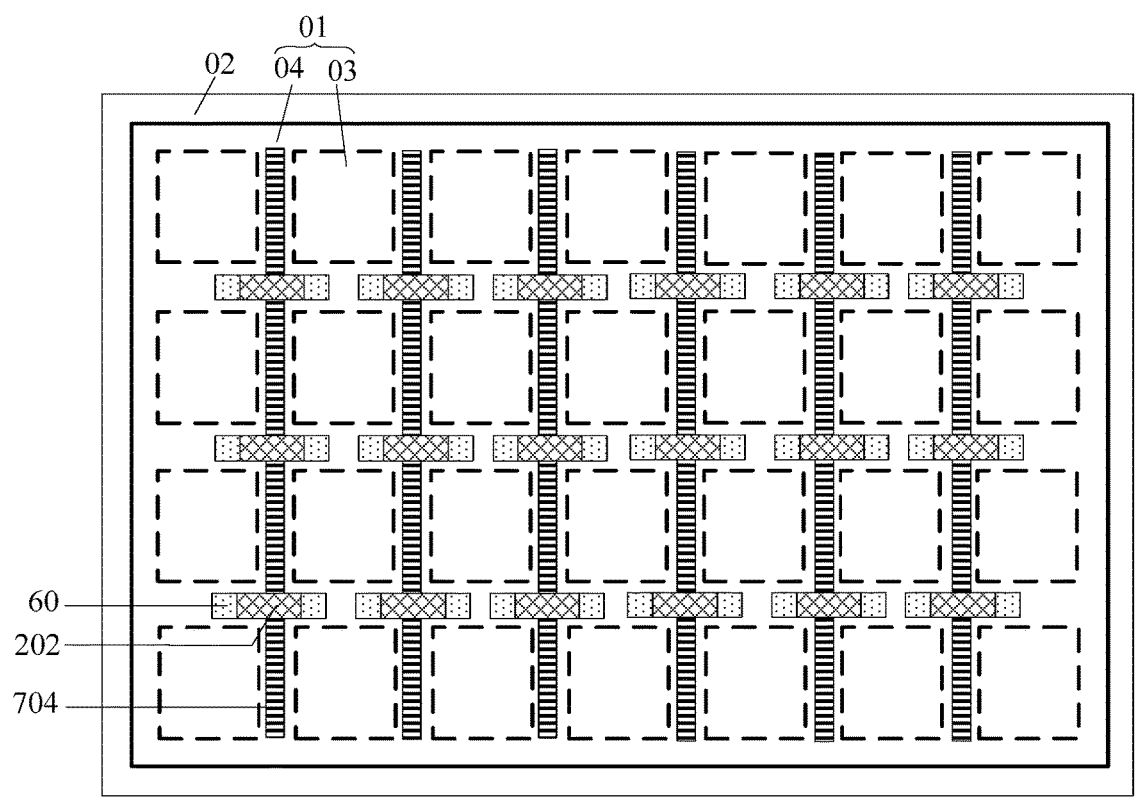
FIG. 11 illustrates a top view of a structural diagram of an OLED substrate according to some embodiments of the present disclosure.

As illustrated in FIG. 11, when the elevating cushions 70 include the fourth elevating sub-layers 704, the fourth elevating sub-layers 704 of the elevating cushions 70 can be provided as strips parallel to the data lines, and the fourth elevating sub-layers 704 can be insulated from the data lines.

Figure 12:
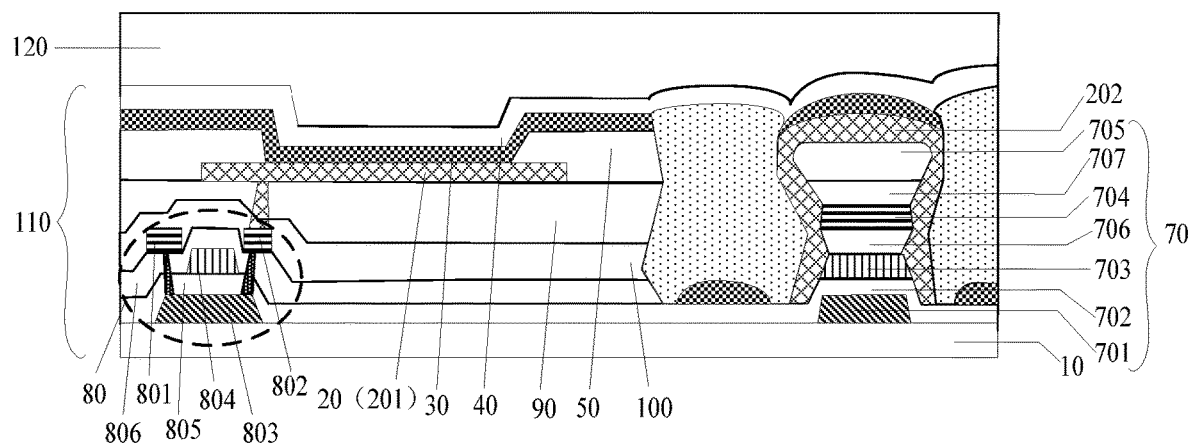
FIG. 12 illustrates a side view of structural diagram of an OLED display apparatus according to some embodiments of the present disclosure.

In another aspect, an OLED display apparatus can be provided. As illustrated in FIG. 12, the OLED display apparatus can include an OLED substrate 110 and a packaging layer 120 that can be utilized to package the OLED substrate 110; the OLED substrate 110 can be any one of the abovementioned OLED substrates.

In some embodiments, the packaging layer 120 can be a packaging substrate, for example, a glass substrate or a color film substrate. In some other embodiments, the packaging layer 120 can be a packaging thin film, e.g., barrier film. The material of the packaging film can be polymer or other suitable material.

The OLED display apparatus can be any components or products that has a display function, no matter the content to be displayed is moving (for example, video) or still (for example, still image), and no matter the content to be displayed is text or image.

The OLED substrate and OLED display apparatus according to embodiments of the present disclosure can be incorporated in a variety of electronic devices or can be related to a variety of electronic devices, for example, mobile phones, wireless devices, personal digital assistants (PDA), tablets, laptops, GPS receivers/navigators, cameras, MP4 video players, video cameras, computer game consoles, watches, clocks, calculators, TV monitors, flat display panels, computer monitors, vehicle display devices (for example, odometer display device), navigators, cockpit control devices and/or display devices, display devices for camera views (for example, camera rear view display device in a vehicle), digital frames, electronic billboards, projectors, construction structures, packaging structures or fine arts structures (for example, a display device for displaying the images of jewelry).

In addition, the OLED display apparatus can also be an OLED display panel, a smart TV, a virtual reality (VR)/augmented reality (AR) device, a head-mount display (HMD) device, a head-up display (HUD) device, smart eyewear (e.g., glasses), etc.

Controlling the pixels can be implemented with thin-film transistors (TFTs), or other electronics configuration, such as flexible electronics.

Various embodiments of the present disclosure provide an OLED display apparatus, the OLED display apparatus can include any one of the abovementioned OLED display substrates, the OLED display substrate in the OLED display apparatus has the same structures and beneficial effects as the OLED substrate provided by the embodiments of the present disclosure, because the OLED substrate have been described above in detail, it will not be repeated herein.

The foregoing has provided a detailed description on an OLED substrate and an OLED display apparatus according to some embodiments of the present disclosure. Specific examples are used herein to describe the principles and implementations of some embodiments. The description is only used to help understanding some of the possible methods and concepts. Meanwhile, those of ordinary skill in the art can change the specific implementation manners and the application scope according to the concepts of the present disclosure. The contents of this specification therefore should not be construed as limiting the disclosure.

In addition, those of ordinary skill in the art will also understand that the embodiments described in the specification are just some of the embodiments, and the involved actions and portions are not necessarily all required to realize the functions of the various embodiments.

Various embodiments in this specification have been described in a progressive manner, where descriptions of some embodiments focus on the differences from other embodiments, and same or similar parts among the different embodiments are sometimes described together in only one embodiment.

It should also be noted that in the present disclosure, relational terms such as first and second, etc., are only used to distinguish one entity or operation from another entity or operation, and do not necessarily require or imply these entities having such an order or sequence. It does not necessarily require or imply that any such actual relationship or order exists between these entities or operations.

Moreover, the terms "include," "including," or any other variations thereof are intended to cover a non-exclusive inclusion such that a process, method, article, or apparatus that comprises a list of elements including not only those elements but also those that are not explicitly listed, or other elements that are inherent to such processes, methods, goods, or equipment.

In the case of no more limitation, the element defined by the sentence "includes a . . . " does not exclude the existence of another identical element in the process, the method, the commodity, or the device including the element.

In the descriptions, with respect to device(s), terminal(s), etc., in some occurrences singular forms are used, and in some other occurrences plural forms are used in the descriptions of various embodiments. It should be noted, however, that the single or plural forms are not limiting but rather are for illustrative purposes. Unless it is expressly stated that a single device, or terminal, etc. is employed, or it is expressly stated that a plurality of devices, or terminals, etc. are employed, the device(s), terminal(s), etc. can be singular, or plural.

Based on various embodiments of the present disclosure, the disclosed apparatuses, devices, and methods can be implemented in other manners. For example, the abovementioned terminals devices are only of illustrative purposes, and other types of terminals and devices can employ the methods disclosed herein.

Dividing the terminal or device into different "portions," "regions" "or "components" merely reflect various logical functions according to some embodiments, and actual implementations can have other divisions of "portions," "regions," or "components" realizing similar functions as described above, or without divisions. For example, multiple portions, regions, or components can be combined or can be integrated into another system. In addition, some features can be omitted, and some steps in the methods can be skipped.

Those of ordinary skill in the art will appreciate that the portions, or components, etc. in the devices provided by various embodiments described above can be configured in the one or more devices described above. They can also be located in one or multiple devices that is (are) different from the example embodiments described above or illustrated in the accompanying drawings. For example, the circuits, portions, or components, etc. in various embodiments described above can be integrated into one module or divided into several sub-modules.

The order of the various embodiments described above are only for the purpose of illustration, and do not represent preference of embodiments.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation to encompass such modifications and equivalent structures.

The invention claimed is:

1. An organic light-emitting diode (OLED) substrate comprising:
   a base substrate, comprising a display region, the display region being divided into a plurality of luminous regions and a non-luminous region separating one or more adjacent luminous regions, the non-luminous region comprising a plurality of first connection regions;
   a first electrode layer provided over the base substrate, wherein the first electrode layer comprises a plurality of first electrodes, the projection of the plurality of the first electrodes on the base substrate covers the plurality of luminous regions;
   a pixel defining layer provided on the first electrode layer, wherein the pixel defining layer is located at the non-luminous region and defines the plurality of luminous regions, the pixel defining layer is hollowed out at the first connection regions;
   an electroluminescent functional layer provided on the pixel defining layer;
   a second electrode layer provided on the electroluminescent functional layer; and
   a plurality of conductive structures located at the plurality of first connection regions respectively, wherein the plurality of conductive structures are electrically coupled to the second electrode layer;
   wherein
   the electroluminescent functional layer is disconnected from the first connection regions at an edge portion of the first connection regions;
   surfaces of the conductive structures that are opposite from the base substrate are higher than a surface of the pixel defining layer that is opposite from the base substrate both with respect to an upper surface the base substrate;
   the conductive structures are located at a side of the second electrode layer that is opposite from the electroluminescent functional layer; and
   the non-luminous region further comprises a plurality of second connection regions, wherein at least one second connection region is adjacent to at least one first connection region;

wherein the OLED substrate further comprises:
  a plurality of elevating cushions provided at the second connection regions; and
  a plurality of first auxiliary electrodes provided on the plurality of elevating cushions, wherein at least one first auxiliary electrode covers sides of an elevating cushion and a surface of an elevating cushion that is opposite from the base substrate;
  wherein at least one conductive structure is in contact with the portion of the first auxiliary electrode located at the sides of the elevating cushions.

2. The OLED substrate according to claim 1, wherein the conductive structures are located between the electroluminescent functional layer and the second electrode layer.

3. The OLED substrate according to claim 1, wherein the pixel defining layer is hollowed out at the second connection regions, and wherein the first auxiliary electrodes and the first electrode layer are located at a same layer and made of a same material.

4. The OLED substrate according to claim 1, wherein the OLED substrate further comprises a plurality of thin film transistors and a planarization layer configured between each of the thin film transistors and the first electrode layer, wherein each thin film transistor comprises a source electrode, a drain electrode, an active layer, a gate electrode and a gate insulating layer, the drain electrode being electrically connected to a first electrode.

5. The OLED substrate according to claim 4, wherein:
  each elevating cushion comprises at least one of a first elevating sub-layer, a second elevating sub-layer, a third elevating sub-layer, a fourth elevating sub-layer, and a fifth elevating sub-layer being arranged in a stacked configuration;
  the first elevating sub-layer and the active layer are located at a same layer and made of a same material;
  a portion of the gate insulating layer that is located at a second connection region forms a second elevating sub-layer;
  the third elevating sub-layer and the gate electrode are located at a same layer and made of a same material;
  the fourth elevating sub-layer, the source electrodes and the drain electrodes are located at a same layer and made of the same material; and
  the fifth elevating sub-layer and the planarization layer are located at a same layer and made of a same material.

6. The OLED substrate according to claim 5, wherein a side portion of a fifth elevating sub-layer is connected to a surface of the fifth elevating sub-layer that is close to the second electrode layer by means of an arc segment.

7. The OLED substrate according to claim 5, wherein each of the thin film transistors further comprises:
  an interlayer dielectric layer being hollowed out at the first connection regions;
  wherein portion of the interlayer dielectric layer located at the second connection region forms a sixth elevating sub-layer.

8. The OLED substrate according to claim 7, wherein a side portion of the sixth elevating sub-layer is provided as an inclined plane, wherein a surface area of a sixth elevating sub-layer that is close to the second electrode layer is larger than an alternative surface area of a sixth elevating sub-layer that is opposite from the second electrode layer.

9. The OLED substrate according to claim 8, wherein the OLED substrate further comprises a passivation layer provided between the thin film transistors and the planarization layer, wherein a portion of the passivation layer located at a second connection region forms a seventh elevating sub-layer of the elevating layer.

10. The OLED substrate according to claim 9, wherein a side portion of the seventh elevating sub-layer is provided as an inclined plane, the surface area of a seventh elevating sub-layer that is close to the second electrode layer is larger than the surface areas of a seventh elevating sub-layer that is opposite from the second electrode layer.

11. The OLED substrate according to claim 1, wherein a plurality of conductive structures are provided at a first side and a second side of each elevating cushion, the second side is opposite to the first side, at least a portion of each of the first auxiliary electrodes being located at the first side and the second side of the elevating cushion, wherein each the first auxiliary electrode are in contact with the conductive structures provided at both sides of the elevating cushion.

12. The OLED substrate according to claim 11, wherein each of the conductive structures are provided as strips extending in the direction parallel to any side of the substrate.

13. The OLED substrate according to claim 12, wherein the conductive structures are provided in a form of points.

14. An organic light-emitting diode (OLED) display apparatus, comprising:
  the OLED substrate according to claim 1; and
  a packaging layer, wherein the packaging layer is utilized to package the OLED substrate.

15. A method of manufacturing method the OLED substrate according to claim 5, the method comprising:
  forming a semiconductor thin film layer through a physical vapor deposition (PVD) process over the base substrate;
  patterning the semiconductor thin film through a photolithography process; and
  implementing an etching process to form the active layer and the first elevating sub-layer of the each elevating cushion simultaneously.

16. The method of claim 15, further comprising:
  simultaneously forming the second elevating sub-layer and the first elevating sub-layer of the each elevating cushion with portions of the gate insulating layer that are located at the second connection regions; and
  forming the third elevating sub-layer of the each elevating cushion concurrently with the gate electrode, wherein the third elevating sub-layer and the gate electrode are located at a common layer and made of a same material.

* * * * *